United States Patent [19]

Baghdady

[11] Patent Number: 4,513,249

[45] Date of Patent: Apr. 23, 1985

[54] METHOD AND APPARATUS FOR SIGNAL DETECTION, SEPARATION AND SUPPRESSION

[76] Inventor: Elie J. Baghdady, 21 Overlook Dr., Weston, Mass. 02193

[21] Appl. No.: 357,576

[22] Filed: Mar. 12, 1982

Related U.S. Application Data

[62] Division of Ser. No. 32,405, Apr. 23, 1979, Pat. No. 4,328,591.

[51] Int. Cl.[3] .......................... H04B 7/12; H04L 1/04; H03K 9/02

[52] U.S. Cl. .................................... 328/150; 328/165; 328/167

[58] Field of Search ............... 328/150, 162, 165, 167, 328/168, 169, 139; 307/542, 543, 556; 455/303, 205, 210, 296, 305, 306

[56] References Cited

U.S. PATENT DOCUMENTS

| | | | |
|---|---|---|---|
| 3,101,446 | 8/1963 | Glomb et al. | 328/162 |
| 3,141,134 | 7/1964 | Osborne et al. | 328/162 |
| 3,478,268 | 11/1969 | Coviello | 455/303 |
| 3,911,366 | 10/1975 | Baghdady | 455/303 |
| 4,092,603 | 5/1978 | Harrington | 455/303 |

*Primary Examiner*—John Zazworsky

*Attorney, Agent, or Firm*—Burns, Doane, Swecker & Mathis

[57] ABSTRACT

The disclosure relates to methods and devices for separating and suppressing an interfering or jamming signal which is the strongest of a plurality of linearly combined signals and which carries modulation including at least amplitude modulation. The methods and devices collapse the frequency spectrum of the strongest signal to substantially a single frequency and filter out that single frequency.

6 Claims, 15 Drawing Figures

METHOD AND APPARATUS FOR SIGNAL DETECTION, SEPARATION AND SUPPRESSION

This is a division of application Ser. No. 032,405, filed Apr. 23, 1979, now issued as U.S. Pat. No. 4,328,591.

BACKGROUND OF THE INVENTION

This disclosure relates to methods and devices useful in separating the strongest of a plurality of linearly combined signals and suppressing the strongest frequency. Since the methods and devices may operate under almost arbitrary conditions of both amplitude and exponent modulation on the signal to be suppressed, the methods and devices are particularly adapted to defeat electronic jamming. In addition the methods and techniques may be employed in the on-line measurement of relative powers of a desired signal and undesired signal or noise powers.

A number of effective related techniques for signal suppression have been described in applicant's U.S. Pat. No. 3,911,366. Those prior techniques, while proven effective against signals of constant amplitude but carrying exponent modulation, are generally either degraded by significant levels of amplitude modulation (as in the case of the so-called "feedforward techniques") or (as in the case of the so-called "dynamic trapping techniques") retain the sideband power caused by amplitude modulation at frequencies that exceed the width of the trapping frequency null. Basically, the dynamic trapping techniques subtract out the exponent modulation of the signal to be suppressed in order to collapse the width of the signal spectrum down to one line, which is then reduced or zeroed out by the trapping "notch".

The techniques disclosed herein provide a dynamic trapping technique that may be used to cancel out both amplitude modulation and exponent modulation on the signal to be suppressed. This has the effect of collapsing all sideband power, whether caused by amplitude or exponent modulation or a combination thereof, down to one spectral line to be nulled out.

Accordingly, it is an object of the present invention to provide a dynamic trapping technique capable of suppressing one of a plurality of signals wherein the signal to be suppressed is amplitude modulated.

It is another object of the present invention to provide a method of separating and suppressing one of a plurality of signals, wherein the suppressed signal is both amplitude modulated and exponent modulated.

It is yet another object of the present invention to provide an effective method for suppressing the power in the sidebands of a signal carrying both amplitude modulation and exponent modulation, in the presence of other signals.

One prior art method for suppressing amplitude modulation on a signal is to employ automatic gain control. This is usually accomplished by first detecting the envelope of the signal. If the AM contains very high frequency components, such as for example in abruptly stepped amplitude changes, the envelope detector must be capable of following the fast fluctuations or the abrupt amplitude steps very closely. Otherwise, so-called "diagonal clipping" will occur. This often imposes severe reaction-time (or time-constant) requirements on the design of the envelope detector circuit.

Accordingly, it is an object of the present invention to provide a simple technique for detecting the envelope of a signal.

It is another object of the present invention to provide a technique for envelope detection that is substantially free of the possibility of diagonal clipping.

It is yet another object of this invention to provide an alternative to using automatic gain control to effect the suppression of AM on a given signal.

The measurement of signal-to-noise ratio requires separation of a desired signal from a noise or interfering signal.

Accordingly, it is a further object of this invention to provide methods and devices for separating out a signal carrying both amplitude modulation and exponent modulation to facilitate the measurement of the relative powers or the power ratios of two or more combined signals.

Envelope detection is frequently employed in the processing of signals imposed on a carrier wave. Further, it has been determined that a signal proportional to a reciprocal of the envelope (or amplitude) of an amplitude modulated signal is useful for signal processing, particularly where the amplitude modulated signal is to be separated from other linearly combined signals.

Accordingly, it is yet another object of the present invention to provide a technique for deriving the reciprocal of the envelope of a signal carrying amplitude modulation.

These and other objects and features of the invention will become apparent from the claims, and from the following description when read in conjunction with the accompanying drawings.

DETAILED DESCRIPTION

Figure 1:
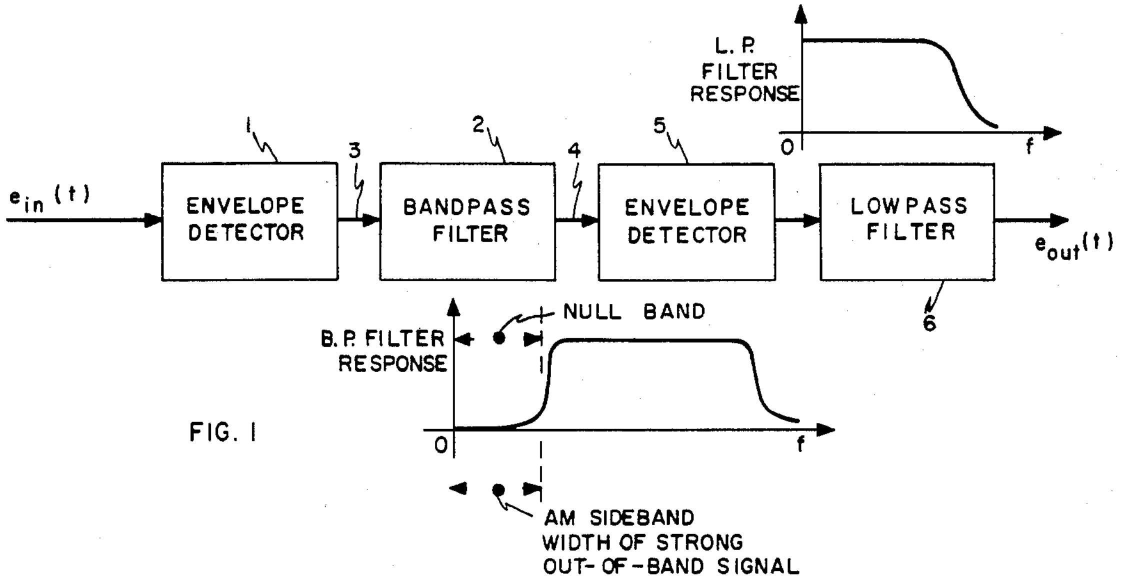
FIG. 1 is a schematic illustration of an embodiment of the present invention for suppressing a strong signal centered at an off-band frequency and carrying a relatively slow amplitude modulation.

The present invention relates to receiving systems and methods for suppressing a signal generally carrying both amplitude and exponent modulation in the presence of other relatively weaker signals and/or noise, and to the application of these methods to the measurement of relative characteristics of the strong signal and the weaker components, such as the ratio of their average powers, their frequency difference, and so forth. Although primary emphasis is placed herein on the eventual nulling out of the single-frequency component into which the power in the combined amplitude and exponent modulation is compressed, the result of such a modulation compression may also be used to effect coherent synchronous detection of a signal as well as for the establishment of a clock reference or the determination of a doppler shift carried by the signal.

As used herein the words "amplitude modulation" are occasionally abreviated as "AM". The words "exponent modulation" are intended to identify frequency or phase modulation ("FM" or "$\phi$M"), sometimes also called "angle" modulation.

An important application of the present invention is the defeating of electronic jamming. In this application, the jamming modulation process is essentially reversed in the receiver to suppress the typically stronger jamming signal. To reverse the jamming modulation process for the purpose of suppressing it or, generally, to suppress a stronger signal, power is taken out of the amplitude modulation side bands and, if necessary, the exponent modulation side bands of the stronger signal and put in a single carrier frequency. This process is referred to as "collapsing" the signal spectrum to substantially a single frequency. The carrier frequency may then be easily eliminated by filtering.

The technique will cease suppressing a particular signal if the amplitude of that signal drops below that of another signal, linearly combined with it. This rarely occurs in electronic jamming. In such a situation the assumed condition that the particular signal is the strongest is, of course, not met, and whichever signal is strongest at that point in time will be the signal which is suppressed.

The signal supression methods of the present invention extend the dynamic trapping concept of Applicant's U.S. Pat. No. 3,911,366 to situations in which the signal to be suppressed (1) carries a mixture of FM or $\phi$M having at best a constant amplitude and at worst a modulated amplitude with severe limitations on modulation rate and depth or (2) carries more than just substantially pure double-sideband type of AM with a nearly constant carrier (or reference) frequency and phase. The signal suppression methods of the present invention address situations in which the signal to be suppressed may carry arbitrary degrees, rates and combinations of amplitude modulation and exponent modulation. The signal to be suppressed is generally presumed to interfere with or to prevent the separate successful isolation and reception of one or more other relatively weaker signals.

The methods and devices of the present invention may operate on the sum of two or more signals in such a way that the spectrum of the strongest signal is dynamically compressed to substantially only one component at a frequency that continuously falls within the rejection notch of a trap. Successful implementation of this concept involves isolation, synthesis or enhancement of the strongest signal or the generation of a signal referred to hereinafter as a "modulation wipe-off signal" or "$e_{MWO}(t)$". These signals may be used to effect a frequency transformation of all component signals of the receiver input such that the strongest signal is placed at all times within the rejection notch of the trapping filter. Practical implementations may locate these dynamic trapping operations in the RF, IF or low-pass sections of a receiving system, depending upon considerations of selectivity, tuning range, insertion loss, and dynamic range requirements, and the characteristics of the desired signal waveform. The salient feature of this technique is that is is designed to precede the final signal demodulation, correlation detection or parameter-measurement stages and hence the interference rejection advantages of the dynamic trap add directly with any anti-interference processing gain of signal demodulators, correlation detectors and parameter estimators. Inasmuch as the interference is suppressed before the final detection operations, difficulties are avoided in separating and isolating signal and distortion products associated with capture of demodulators or overdrive of correlation detectors by the interference and with post-detection operations. The dynamic trapping technique, although designed primarly to suppress a single interference signal, is also adapted to multiple interference situations.

In practical applications, the requirements for signal suppression will vary according to strength, spectra, etc. of the of the signals combined in the received signal, as well as the suppression performance desired. Various embodiments of the present invention are described below which are adapted to perform under particular signal conditions and performance requirements. Accordingly, the discussion will consider a succession of important illustrative embodiments of the inventions. For convenience, the various embodiments may be classified on the basis of whether the signal to be suppressed is transformed to a single spectral line at some nonzero intermediate frequency or at zero Hz (or DC). These embodiments are referred to as "Dynamic IF Trapping" and "Dynamic Zero-Hz Nulling," respectively.

In one situation that is frequently encountered in communication, remote sensing (e.g., direction finding), remote probing (e.g., radar), and similar systems operating in spectrally congested frequency bands, an out-of-band undesired signal (hereafter called "the interference") survives heavy out-of-band attentuation in the receiver and appears in the output of the intermediate-frequency (IF) amplifier to be stronger than the in-band signal (hereafter called the signal). It is known that this causes envelope, phase and frequency demodulators to be captured by the undesired out-of-band signal, with the result that the post-demodulator filters reject the desired signal modulation completely. This problem can be simply and effectively solved by using the zero-Hz nulling schemes illustrated in FIGS. 1 and 2.

With reference to FIG. 1, note that if $$e_{in}(t)=A_s(t)\cos[\omega_s t+\psi_s(t)]+A_i(t)\cos[\omega_i t+\psi_i(t)] \quad (1)$$

where the subscript "s" denotes "signal" and "i" denotes "interference", then if $$|A_i(t)|>>|A_s(t)| \quad (2)$$

the output 3 of an envelope detector 1 is approximately $$V(t)\approx A_i(t)+A_s(t)\cos[(\omega_s-\omega_i)t+\psi_s(t)-\psi_i(t)] \quad (3)$$

This shows that regardless of the exponent modulation, $\psi_i(t)$, on the interference, the envelope detector output, under condition (2), yields $A_i(t)$, the modulated amplitude of the interference in the frequency range centered at zero Hz. The weaker signal contribution to V(t) is principally the second term in Equation (3). Accordingly, $A_i(t)$ can be suppressed by a filter 2, having a transmission null at zero Hz, which rejects effectively all frequencies extending from zero Hz to the full width of one AM sideband of the interference as indicated by the graph inset. The AM of the weaker signal can be detected by envelope detector 5 if the second component in Equation (3) is not significantly distorted by the action of filter 2.

The performance of the scheme of FIG. 1 in salvaging the weaker signal is limited by the requirement that the frequency difference $|\omega_s-\omega_i|$ be large enough that no significant part of the spectrum of the second term in Equation (3) will fall within the "null band" near zero Hz of the filter 2. Moreover, if $\psi_s(t)$ represents part or all of the desired information, then the second component in Equation (3) must be subjected to further action to subtract out $\psi_i(t)$.

Figure 2:
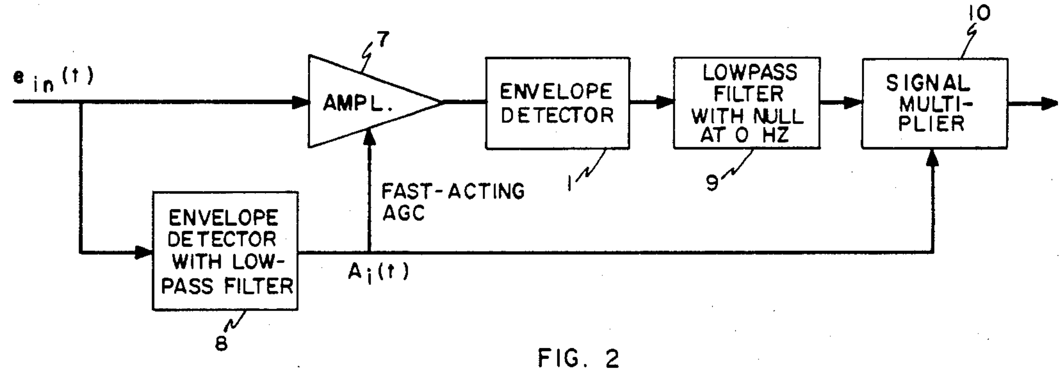
FIG. 2 is a schematic illustration of an embodiment of the present invention which utilizes fast-acting automatic gain control to facilitate the suppression of a strong signal centered at an off-band frequency and carrying relatively fast amplitude modulation.

The null band in the response of filter 2 can be reduced to a negligible width by employing fast-acting automatic gain control (AGC) as illustrated in FIG. 2. In this figure, the gain of amplifier 7 is controlled by $A_i(t)$ which, from Equation (3), will appear in the output of the envelope detector and lowpass filter 8. Under condition (2), the second term in Equation (3) will have a negligible effect on the AGC even if it is not entirely rejected by the lowpass filter. However, if the spectrum of $A_i(t)$ overlaps completely with the spectrum of the second term in Equation (3) then both schemes in FIGS. 1 and 2 will fail.

The output signal of the amplifier 7 is envelope detected by the envelope detector which corresponds to the envelope detector identified with the identical numeral in FIG. 1. The output signal of the envelope detector is filtered by a lowpass filter having a null at zero Hertz.

If the second term in Equation (3) is effectively suppressed in the output of the envelope detector and lowpass filter 8, then the fast-acting AGC in effect divides each term in Equation (3) by $A_i(t)$. Accordingly, the output of the lowpass filter 9 may be multiplied with $A_i(t)$ by multiplier 10 in order to cancel $A_i(t)$ out of the amplitude of the weaker-signal component in the output signal of the lowpass filter 9.

One practical problem not considered in the preceding analysis is the response time of practical prior art envelope detectors. The fluctuations in the envelope, V(t), of the resultant of the two signals in Equation (1) may be too fast for efficient conventional envelope detectors to follow, which would give rise to the effect known in practice as diagonal clipping. The inability of the envelope detector 1, in either FIG. 1 or FIG. 2, to follow a very rapidly fluctuating V(t), with the consequent occurrence of diagonal clipping, would generally invalidate the approximation in Equation (3) as well as all of the reasoning based on this equation. A scheme for accomplishing envelope detection under arbitrary conditions of envelope fluctuation without incurring diagonal clipping is illustrated in FIG. 3.

Figure 3:
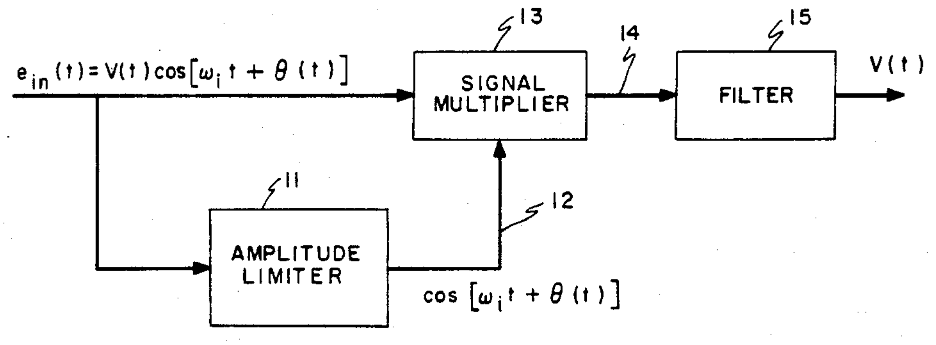
FIG. 3 is a schematic illustration of an embodiment of the present invention which provides envelope detection substantially free of diagonal clipping even under conditions of rapid amplitude change.

With reference to FIG. 3, $e_{in}(t)$ of Equation (1) can, under the condition $|A_i(t)|>|A_s(t)|$ be rewritten in the form $$e_{in}(t)=V(t)\cos[\omega_i t+\theta(t)] \quad (4)$$

The output signal 12 of an amplitude limiter 11 can therefore be expressed as $\cos[\omega_i t+\theta(t)]$ which is then multiplied with $e_{in}(t)$ by a multiplier 13. The resultant signal 14 is $$V(t)\cos^2[\omega_i t+\theta(t)]=\tfrac{1}{2}V(t)\cos^2[\omega_i+\theta(t)] \quad (5)$$

A suitable conventional filter 15 can be provided to reject the component at the double-frequency term in Equation (5) and pass V(t).

Figure 4:
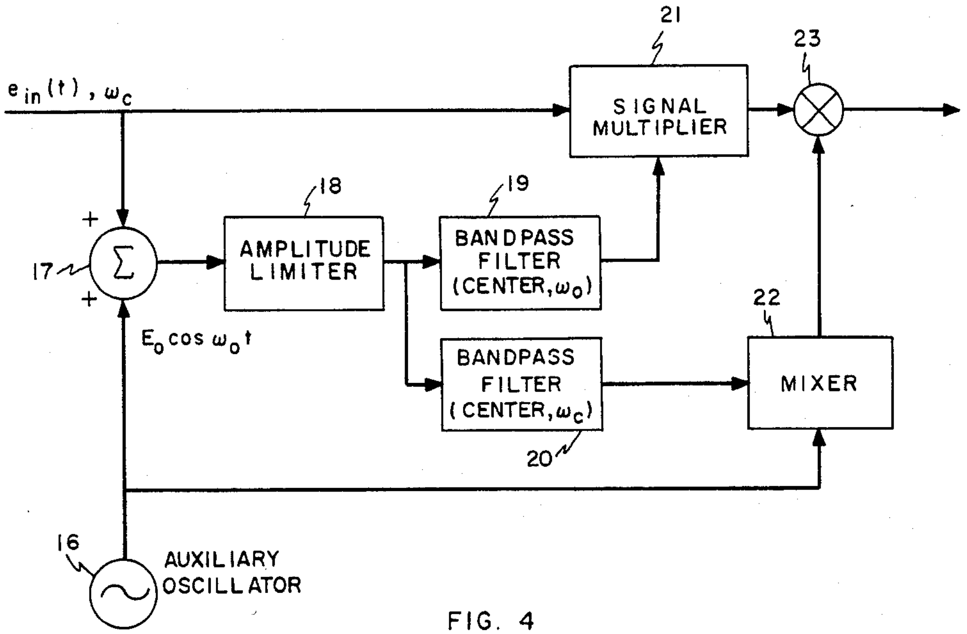
FIG. 4 is a schematic illustration of an embodiment of the present invention for deriving from an input signal another signal whose envelope is the reciprocal of that of the given signal.

Another factor that may limit the performance of the scheme in FIG. 2 is the overall AGC response time when abrupt and otherwise generally fast amplitude fluctuations are encountered. FIG. 4 illustrates a scheme for cancelling out the amplitude fluctuations of the stronger interference even under conditions of fluctuation speed that may cause serious design problems for conventional AGC circuits. The technique of FIG. 4 works even when the spectra are completely overlapping, a condition that would cause the schemes in FIGS. 1 and 2 to fail.

In FIG. 4, an input signal $e_{in}(t)$ and a reference frequency signal from an oscillator 16 are applied to a summing circuit 17. An output sum signal from the summing circuit is then amplitude limited by a limiter 18 and subsequently filtered. The effect of these steps is best understood with reference to the following equation for the output sum signal:

$$e(t)=A_i(t)\cdot\cos[\omega_c t+\psi_i(t)]+E_o\cos\omega_o t+A_s(t)\cos[\omega_c t+\psi_s(t)] \quad (6)$$

In this equation $$A_s(t)<<E_o<<A_i(t),\text{ and } |\omega_c-\omega_o|>>|\psi_s(t)-\psi_i(t)| \quad (7)$$

and $\psi(t)$'s represent general phase modulations of the strong interfering signal and the relatively weak desired signal. The sum in Equation (6) is recognized to consist of an interference signal, a much weaker signal, and a constant-amplitude constant-frequency reference signal or carrier. Under the conditions on the relative amplitudes indicated in Equation (7) the amplitude-limited resultant of this sum, appearing at the output terminal of the limiter 18 can be expressed as $$e_{18}(t)\approx\cos[\omega_c t+\psi_i(t)]-\frac{1}{2}\,\frac{E_o}{A_i(t)}\cos[(2\omega_c-\omega_o)t+2\psi_i(t)]+ \quad (8)$$

-continued $$\frac{1}{2}\frac{E_o}{A_i(t)}\cos\omega_o t-\frac{A_s(t)}{A_i(t)}\sin[\psi_s(t)-\psi_i(t)]\sin[\omega_c t+\psi_i(t)]$$

Under the condition on frequencies indicated in Equation (7), the first and fourth terms in Equation (8) overlap in spectrum and are totally separate from the second and third terms, which themselves are also totally separate. Accordingly, and as indicated in FIG. 4, the first and fourth terms in Equation (8) may be selected by a bandpass filter 20, and the third term may be selected by a bandpass filter 19. The second term is of no interest in this discussion, and is eliminated because it will not be passed by either of the two bandpass filters in FIG. 4.

A first filtered signal from the bandpass filter 19 may be multiplied with the input signal by a multiplier 21. The output signal of the multiplier 21 in FIG. 4, after appropriate filtering, is described by $$e_{21}(t)=\cos[(\omega_c-\omega_o)t+\psi_i(t)]+\frac{A_s(t)}{A_i(t)}\cos[(\omega_c-\omega_o)t+\psi_a(t)] \quad (9)$$

The interference term is now of constant amplitude and can therefore be very effectively suppressed by a dynamic trapping circuit or other devices described in Applicant's U.S. Pat. No. 3,911,366.

In the scheme of FIG. 4, the output signal of the bandpass filter 20 is translated in frequency to $\omega_c-\omega_o$ rad/sec by a mixer 22, after which it is applied to a multiplier 23. The output signal is the product of equation 9 and translates the output signal of the bandpass filter 20. After appropriate filtering to null out the D.C. component and reject the double frequency term, the following signal is obtained $$e_{23}(t)=\frac{A_s(t)}{A_i(t)}\cos[\psi_s(t)-\psi_i(t)] \quad (10)$$

In systems where $A_s(t)$ is a pulse waveform which is ON for limited time intervals and is zero between the ON times, $e_{23}(t)$ provides a waveform of nonzero energy to indicate when the pulses occur. Detection of when the pulses are present is sufficient for many practical purposes, and can be effected by detecting $e_{23}(t)$ of Equation (10) with a suitable conventional energy detector.

More generally, there are numerous practical applications in which $A_s(t)$ may not be a pulse or a sequence of pulses and, even if it were, more information content of $A_s(t)$ and/or $\psi_s(t)$ is desired. For simplicity and convenience we distinguish the following situations in addition to the one considered in the preceding paragraph:

(a) The desired information is in the waveform of $A_s(t)$ or (b) The desired information is in $\psi_s(t)$ or its time derivative or (c) The desired information is in both $A_s(t)$ and $\psi_s(t)$ or (d) The desired information is in the difference $\psi_s(t)-\psi_i(t)$ or its time derivative In what follows each of these situations will be considered, and embodiments of this invention will be described to illustrate how the desired waveform can be extracted from $e_{in}(t)$ based on the basic techniques described up to this point. In all cases, the introduction of the auxiliary oscillator 16 in FIG. 4, leading to the output of signal multiplier 21, described by Equation (9), should be made at the earliest point in the receiver where the likelihood of saturation by an excessive input level of interference is low.

In applications corresponding to (a), (b) and (c) above, the desired waveforms can be extracted in a number of ways. In one method, one may start with $e_{21}(t)$ of Equation (9) and suppress the constant-amplitude interference term by means of a dynamic trap described in Applicant's U.S. Pat. No. 3,911,366 to isolate the second term in Equation (9). Once this second term is isolated, it can be multiplied by $A_i(t)$, which can be obtained by direct envelope detection of $e_{in}(t)$. The result is $A_s(t)\cos[\omega_c-\omega_o)t+\psi_s(t)]$, from which $A_s(t)$ and $\psi_s(t)$ or $\dot{\psi}_s(t)$ can be extracted by conventional methods.

The output signal, $e_{23}(t)$, (Equation (10)) of the multiplier 23 in FIG. 4, can be passed through an amplitude limiter to obtain $\cos[\psi_s(t)-\psi_i(t)]$. This enables the determination of $\psi_s(t)-\psi_i(t)$ or of its derivative by conventional means to satisfy the requirements of a number of important CW FM radar applications.

Figure 5:
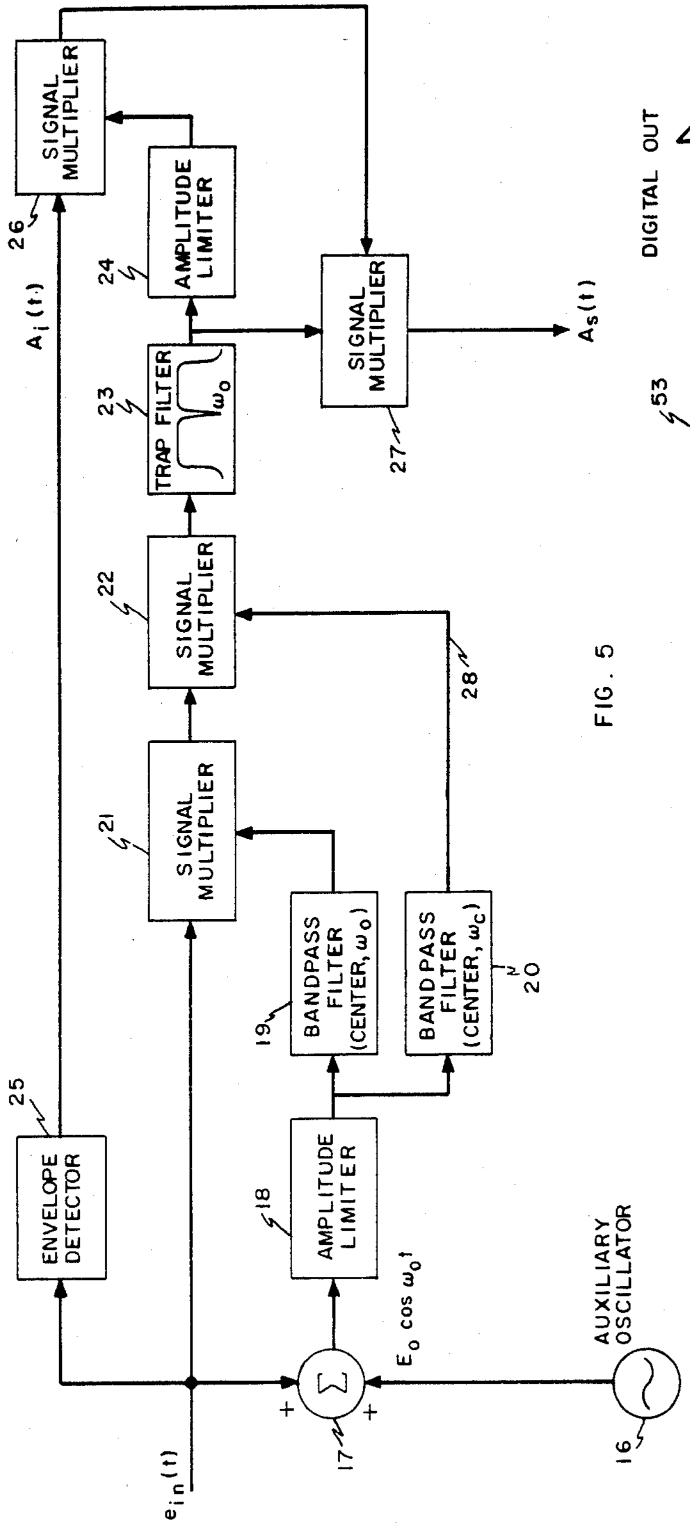
FIG. 5 is a schematic illustration of an embodiment of the present invention for retrofitting an AM receiver to suppress a strong signal at an arbitrary frequency relative to the desired signal.

With reference to FIG. 5, the output signal of bandpass filter 20 multiplies directly the output signal of the multiplier 21 in a second multiplier 22, yielding after appropriate filtering $$e_{22}(t)=\cos\omega_o t+\frac{A_s(t)}{A_i(t)}\cos[\psi_s(t)-\psi_i(t)]\cos\omega_o t \quad (11)$$

The interference component $\cos\omega_o t$ is trapped out in trap filter 23 to obtain $$e_{23}(t)=\frac{A_s(t)}{A_i(t)}\cos[\psi_s(t)-\psi_i(t)]\cos\omega_o t \quad (12)$$

This is then amplitude limited by a limiter 24 and the result multiplied by $A_i(t)$ in a third multiplier 26 to obtain:

$$e_{26}(t)=A_i(t)\cos[\psi_s(t)-\psi_i(t)]\cos\omega_o t \quad (13)$$

Multiplication of $e_{23}(t)$ and $e_{26}(t)$ in a fourth multiplier 27 yields $A_s(t)$, after appropriate filtering.

Figure 6:
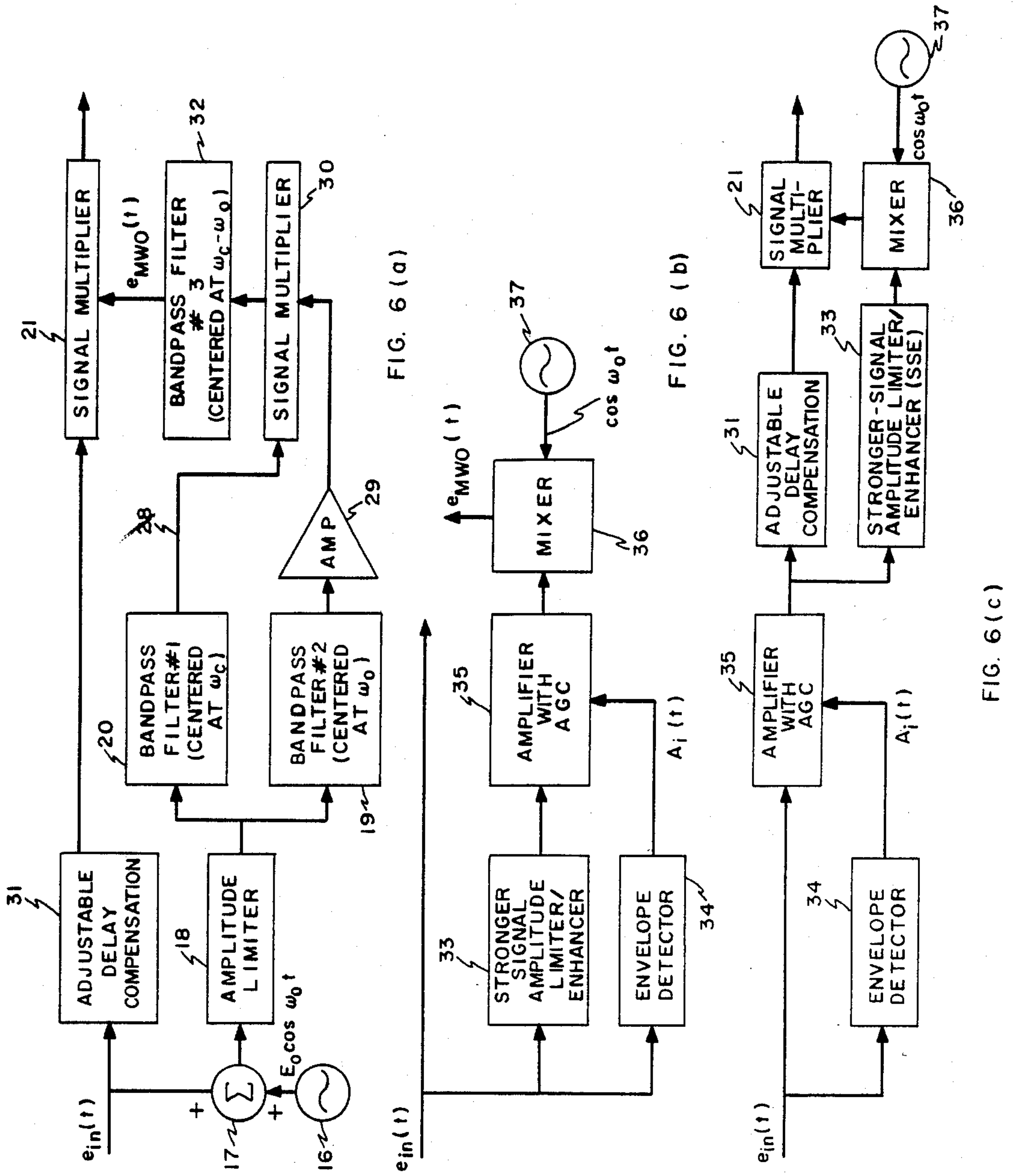
FIGS. 6(*a*), (*b*) and (*c*) are schematic illustrations of embodiments of the present invention for providing signals whose envelope is the reciprocal of the envelope of an input signal, and whose exponent modulation is identical with that of the input signal.

It is important to observe that in the embodiment of FIG. 5, the amplitude modulation $A_i(t)$ of the signal to be suppressed is cancelled out by the multiplication in the multiplier 21, and the exponent modulation $\psi_i(t)$ is subtracted out of the instantaneous phase of the signal to be suppressed by the frequency conversion effect of the multiplication in the multiplier 22. However, the two modulations can simultaneously be wiped off the signal to be suppressed by first multiplying the output signals of the filters 19 and 20 as illustrated in FIG. 6(*a*) to generate a combined "modulation wipe-off signal", $e_{MWO}(t)$, which is then applied to the multiplier 21 in FIG. 6(*a*) to multiply the sum of the input signals, $e_{in}(t)$. In FIG. 6(*a*), an adjustable group-delay compensation line 31 or network that delays $e_{in}(t)$ by the amount introduced in transit through the blocks that generate $e_{MWO}(t)$ is provided. Group-delay compensation is critical to effecting the intended modulation cancellations and subtractions in all of the embodiments of this invention. It has not been represented in a number of the figures for the sake of simplicity.

An alternative method for generating $e_{MWO}(t)$ is illustrated in FIG. 6(*b*). In this figure, the input, $e_{in}(t)$, is applied to a circuit 33 for limiting the amplitude of the signal to be suppressed and to enhance its level relative to the other signal (or signals) present. This can be accomplished by means of an amplitude limiter in most cases, or by means of a feedforward circuit. The output signal of the circuit 33 in FIG. 6(*b*) is then operated on by a fast-acting AGC amplifier 35 where it is, in effect, divided by $A_i(t)$. The output of AGC amplifier 35 is then either multiplied directly by $e_{in}(t)$ (after appropriate group-delay compensation) to prepare the undesired signal for 0-Hz (or DC) nulling, or is frequency-shifted by means of a mixer 36 for effecting the desired suppression in an IF trap centered at $\omega_o$ rad/sec.

FIG. 6(*c*) illustrates a further embodiment of the techniques of this invention to cancel out first the AM by means of the fast-acting AGC 35, and second the exponent modulation is cancelled by the signal multiplier 21. The nulling out of the undesired signal at DC is facilitated by the signal enhancer and amplitude limited circuit 33 whose output signal is applied to the multiplier 21 without the $\omega_o$ frequency shift via the mixer 36.

Figure 7A:
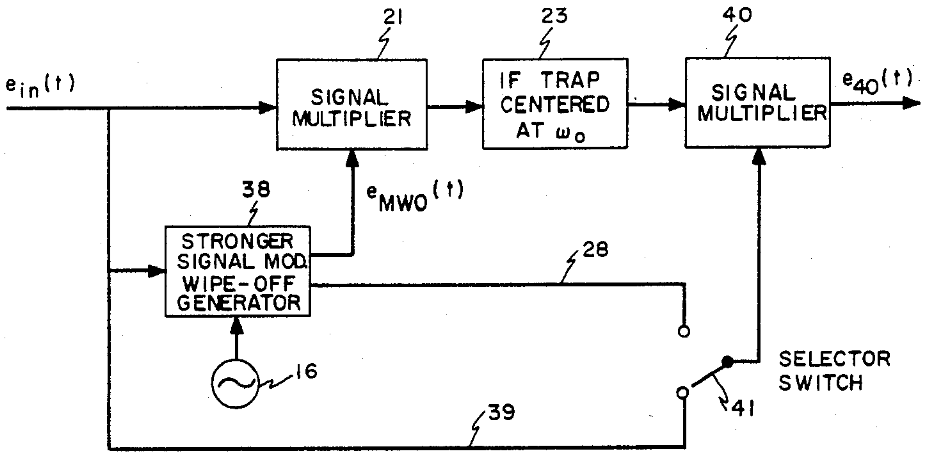
FIGS. 7(*a*) and (*b*) are schematic illustrations of embodiments of the present invention for trapping out a signal carrying both amplitude and exponent modulation in the presence of other relatively weaker signals.
Figure 7B:
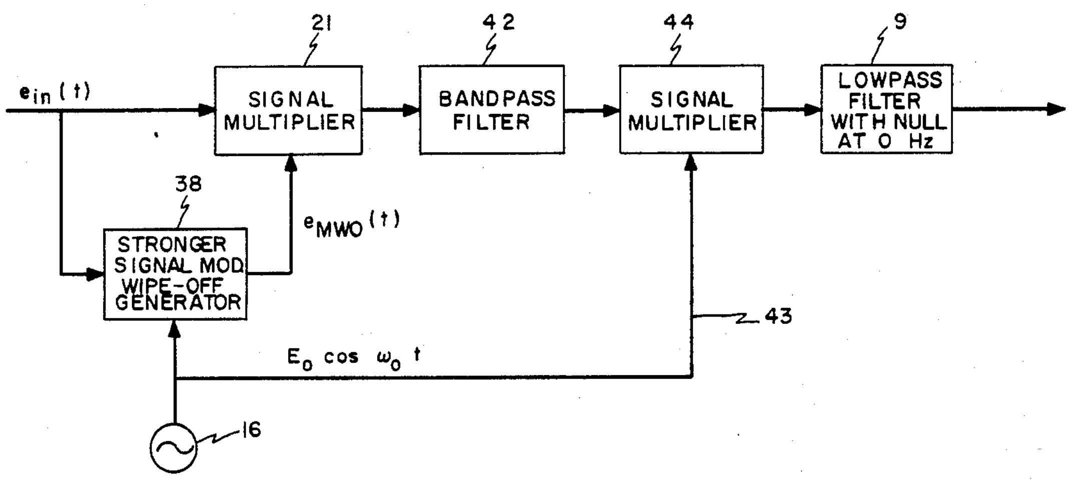

The dynamic IF trapping scheme illustrated in FIG. 7(*a*) is based on the derivation, from the input sum of signals, of an auxiliary stronger-signal amplitude and frequency modulation wipe-off signal, $e_{MWO}(t)$, by either of the techniques just described in conjunction with FIG. 6. In FIG. 7(*a*) the derived signal, $e_{MWO}(t)$, is applied as an LO to a signal-multiplying/frequency conversion stage 21. The output of the stage 21 is a constant-frequency sinusoid whose frequency, $\omega_o$, coincides with the center frequency of the trap-attenuation band, and a second sinusoid whose amplitude is the ratio of the weaker and stronger signal amplitudes, and whose frequency is modulated by the algebraic sum of the frequency modulations of the two input sinusoids. The stronger-signal amplitude and frequency modulations can be cancelled out of the modified signal $e_{23}(t)$ that appears at the output of the trap 23 by multiplying $e_{23}(t)$ in a signal multiplier 40 by a delay-adjusted replica of $e_{in}(t)$, which is designated 30 in FIG. 7(*a*). The use of 28 in place of 39 cancels out only the exponent modulation of the stronger signal from signal $e_{23}(t)$.

The output signal $e_{40}(t)$ consists of the originally weaker signal plus a strongly attenuated interfering signal. The level of the originally stronger signal in $e_{40}(t)$ is proportional to the notch filter stop band attenuation which, in practice, is usually of the order of 60 dB. Thus it is possible with the IF Dynamic Trap, theoretically, to achieve a 60 dB improvement in the level of the desired residual group-delay differences and the characteristics of $e_{MWO}(t)$ usually place the upper limit on the net improvement achievable.

In the scheme of FIG. 7(*b*), the undesired signal is stripped of its amplitude and exponent modulations and nulled out at 0 Hz (or DC). The output signal of the lowpass filter 9 is described by Equation (10). Note that if $A_s(t)$ is a pulse of some defined duration, then $A_s(t)/A_i(t)$ is also a pulse of substantially the same duration as $A_s(t)$ for almost arbitrary $A_i(t)$ of the types normally characterizing CW (i.e., non-pulsed) signals. However, the waveform of $A_s(t)/A_i(t)$ is, generally, quite different from that of $A_s(t)$. Accordingly, if the desired signal pulse waveform and carrier frequency and phase fluctuations are not critical, pulse-energy detection would suffice. However, in radar applications requiring MTI (moving target indication) restoration of pulse shape and carrier phase is necessary. For purposes of emphasizing the similarity and the important different between two approaches, a selector switch, 41, has been added in FIG. 7(*a*). Applying $e_{in}(t)$ to the signal multiplier 40 for the MTI application is simply indicated by the setting shown in FIG. 7(*a*) for the selector switch 41.

The presence of a "notch filter" in the frequency range occupied by the desired signal as modified by the multiplication by $e_{MWO}(t)$ in the multiplier 21 can be expected to remove a fraction of the desired signal power. The narrower the notch, the smaller its effect upon the desired signal. The desired notch bandwidth can be as narrow as is practically feasible if as a result of the multiplication (or mixing) with the modulation wipe-off signal, $e_{MWO}(t)$, the interfering signal is reduced very nearly to a constant-amplitude, constant-frequency sinusoid.

Figure 8A:
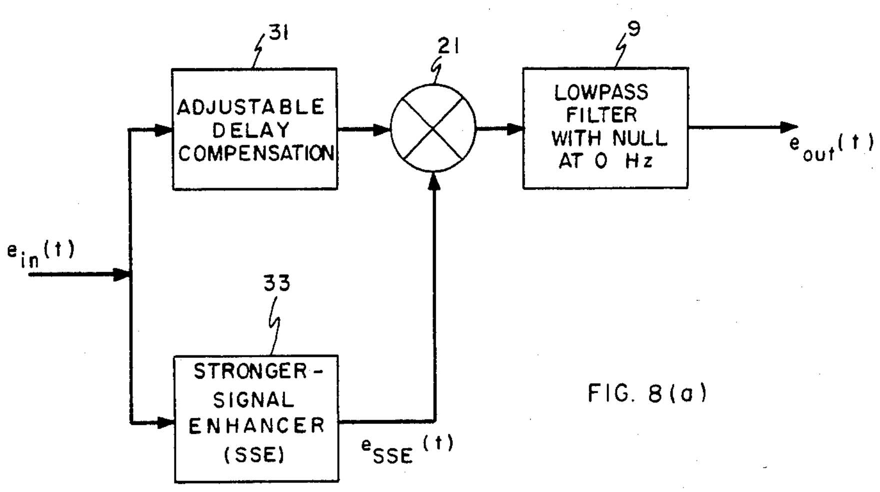
FIGS. 8(*a*) and (*b*) are schematic illustrations of embodiments of the present invention for trapping out a strong exponent modulated signal in the presence of other relatively weaker signals.
Figure 8:
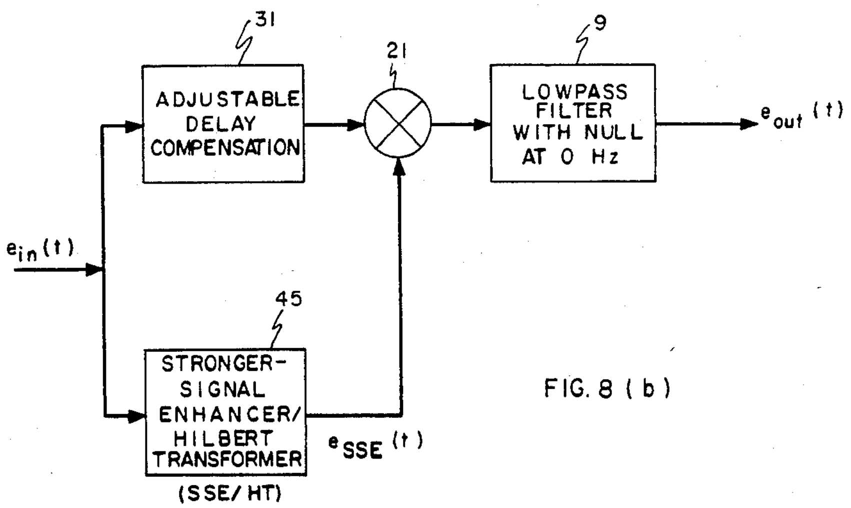

FIG. 8(*a*) shows a variation on the device described in FIG. 3 in which the amplitude limiter 11 of FIG. 3 is replaced by a stronger signal enhancer 33; e.g., a feedforward circuit adjusted for cancellation of the weaker signal, or a narrowband limiter.

FIG. 8(*b*) is a second variation on the device described in FIG. 3 in which the amplitude limiter 11 is replaced by a combined stronger signal enhancer and Hilbert Transformer (or $-\pi/2$ wideband phase shifter) 45, to effect a quadrature cancellation of the stronger signal. The combined Stronger-Signal Enhancer and Hilbert Transformer (SSE/HT) 45 can generally be approximated by a phase-locked loop (PLL). The SSE/HT bandwidth is selected so that it tracks the instantaneous frequency of the stronger signal. The SSE/HT output signal is, then, a constant-envelope replica of the stronger signal (the amplitude fluctuations are suppressed by a limiter associated with the SSE/HT). Thus, we can write $$e_{SSE}(t) = \sin[\omega_c t + \psi_i(t) + \theta_e] \tag{14}$$

The change from cosine to sine is a result of the $-\pi/2$ phase change introduced by the HT, and a phase error $\theta_e$ must be included, which will limit the degree of quadrature cancellation.

The input signal in FIG. 8(*b*) is also applied to an adjustable delay network 31 to compensate for the group delay inevitably introduced in the SSE/HT signal path. The output of the delay-compensation block 31 is then multiplied in the multiplier 21 with the SSE/HT output and the frequency difference is selected. The resulting output signal is $$e_{out}(t) = A_s(t)\sin[\psi_s(t) - \psi_i(t)] + A_i(t)\sin\theta_e \tag{15}$$

Note that $A_i(t)$ is now multiplied by $\sin\theta_e$, which would be zero if $\theta_e = 0$. Since $\sin\theta_e$ can be made very small, it can be seen from Equation (15) that the quadrature multiplication of the interference in FIG. 8(*b*) results in severe attenuation of $A_i(t)$ in the output, and hence alleviates the filtering requirement above zero Hz for suppressing $A_i(t)$.

Finally, it is important to note that whereas the SSE functional block 33 in the "cophasal" zero-Hz nulling scheme of FIG. 8(*a*) could be just a "wideband" limiter that passes the entire spectral zone centered about the frequency $\omega_c$ rad/sec, the same does not hold for the SSE/HT 45 in the "quadrature" zero-Hz nulling scheme of FIG. 8(*b*). Using, for simplicity and convenience, the same notation as Equation (4), we observe that the HT converts the output signal of the "wideband" limiter to $\sin[\omega_i t + \theta(t)]$, which upon multiplication in the multiplier 21 by $V(t)\cos[\omega_i t + \theta(t)]$ followed by lowpass filtering in the lowpass filter 9 would yield a zero output signal.

It has thus far been shown that zero at 0-Hz nulling in its various forms (linear rectification, feedforward cophasal multiplication and quadrature feedforward multiplication) suppresses the strongest of a number of signals that differ in frequency by employing it or the amplitude-limited resultant of these signals as the reference signal (or LO) for down-converting the sum of the signals to a zero-Hz reference frequency for the entire sum of signals. The result of such an operation will, under appropriate handling of the AM on the strongest signal (and conditions on the relative signal amplitudes for linear rectification), be the sum of all but the strongest signal, translated downward in frequency, and now located at carrier frequencies equal to their corresponding frequency differences from the suppressed strongest signal. A second zero-Hz nulling process can then be used to suppress the strongest of the signals that survive the first zero-Hz nulling process. In principle, the zero-Hz nulling process can be repeated until an output signal is obtained in which the desired signal is predominant.

It must be stressed, however, that one or more of the various measures described previously for suppressing amplitude modulation on the strongest signal at each stage must be employed in order to accomplish complete suppression of this signal within a narrow null at zero Hz and thus set the stage for the suppression of the next strongest signal.

A situation of special importance in CW FM radar is one in which the composite signal at the input of the receiver includes, in addition to a target return, a direct transmitting-antenna-to-receiving antenna feedthrough signal, as well as, possibly, one or more reverberations of the feedthrough signal. In situations such as this, where the proximity of the receiving antenna to the transmitting antenna creates a difficult problem of direct feedthrough and it is not practical to affect enough isolation to bring the feedthrough component down to a level at which it can be totally ignored, it is actually much easier to take steps to ensure that the undesired coupling is strong enough so that the feedthrough signal can be expected to remain at all times much stronger than the target returns, and to have this feedthrough component suppressed by the first zero-Hz nulling stage. A second zero-Hz nulling stage in a cascade could then be employed to suppress the next strongest signal be it a strong, extraneously originated interference or the first reverberation of the feedthrough signal. The frequency-shift differences among such feedthrough signals are all predictable from a knowledge of the distance between the transmitting and the receiving antennas and can therefore all be taken into account in computing the frequency shift of true target returns from the measured value of frequency shift of the output of the last zero-Hz trapping stage in the cascaded chain.

In some situations, the desired signal is a sinewave very close in frequency to a relatively stronger attendant interfering sinewave. Assuming the attendant random noise level to be sufficiently low to be ignored in the analysis, let the combination of the two sinusoids be expressed as $$\cos(\omega_c+\omega_f)t + a\cos(\omega_c+\omega_b)t,\ a >> 1$$

If this sum is amplitude limited, the result can be expressed as $$\cos[(\omega_c+\omega_f)t + a\sin(\omega_b-\omega_f)t]$$

Frequency multiplication by a factor k, yields $$\cos[\omega_1 t + ka\sin(\omega_b' - \omega_f)t] = \sum_{-\infty}^{\infty} J_n(ka)\cos[\omega_1 + n(\omega_b - \omega_f)]t$$

where $J_n(ka)$ is a Bessel function of the first kind and order n. The component corresponding to (a) the strong interference has frequency $\omega_1$ rad/sec, and amplitude $J_o(ka)$ (b) the weaker sinusoid has frequency $\omega_1+(\omega_b-\omega_f)$ rad/sec, and amplitude $J_1(ka)$ We now note that the first zero of $J_o(ka)$ occurs for $ka=2.404$, at which value $J_1(ka)\approx 0.52$. Thus, the frequency multiplication factor that will null out the component corresponding to the originally stronger signal is $$\begin{aligned} k &\approx 2.4/a \\ &\approx 24 \text{ if } a = 10^{-1} \text{ (or } -20 \text{ dB)} \\ &\approx 2400 \text{ if } a = 10^{-3} \text{ (or } -60 \text{ dB)} \end{aligned}$$

Such large frequency multiplication factors generally require interspersed frequency down-conversions to keep the reference frequency $\omega_1$ rad/sec within a reasonable range of values.

The signal suppression techniques of this invention are useful for enabling the performance of on-line, real-time quantitative measurement of the quality of the data conveyed by a received signal. Received data quality may be determined by the signal-to-noise ratio (S/N); i.e., the ratio of the average power in the pre-detection (IF) signal to the average power of the attendant disturbances (added noise and interference). This S/N ratio, among all possible indicators of data quality, can be most readily measured in real-time to provide a meaningful and reliable evaluation of the quality of the data over time intervals during which the relative strengths (or powers) of the signal and the attendant noise are very nearly constant. The Signal Quality Measurement (SQM) system illustrated in FIG. 9 will now be described to illustrate the application of techniques of this invention to the performance of IF output S/N ratio measurements in a receiving system.

Figure 9:
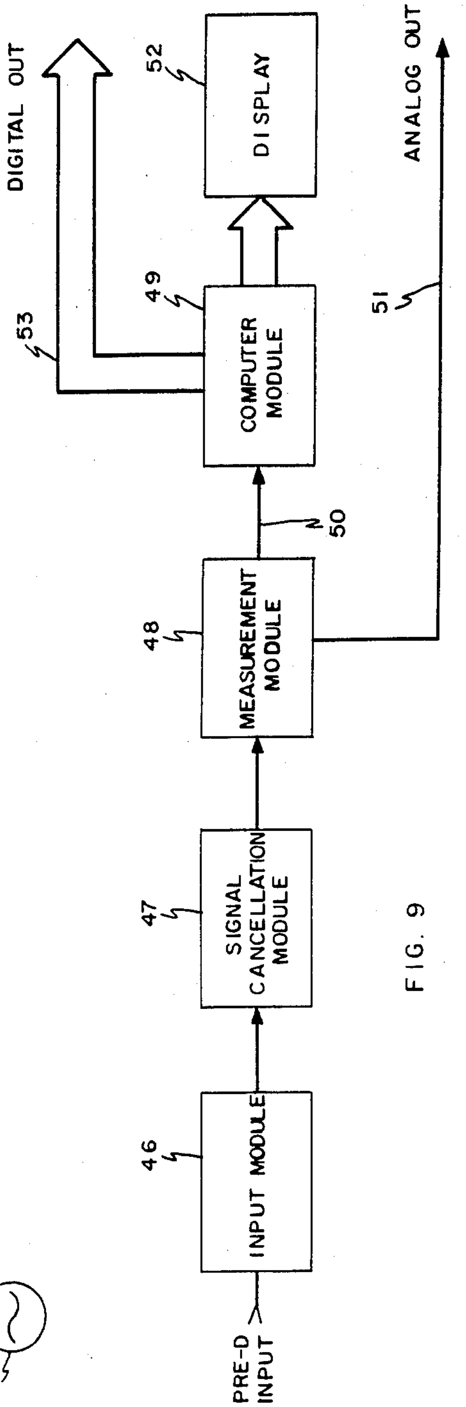
FIG. 9 is a schematic illustration of an embodiment of the present invention for measuring the relative strengths of a desired signal and noise or interference within the passband of a receiving system.

With reference to FIG. 9, the SQM consists of an Input Module 46, a Signal Cancellation Module 47, a Measurement Module 48, and a Computer Module 49.

The Input Module 46 accepts a composite input of signal plus noise, conditions it, and applies it to the Signal Cancellation Module, 47.

The Signal Cancellation Module 47 operates effectively in the reverse of the devices described above in that it suppresses the desired (strong) signal, leaving the noise or interference which are applied to the Measurement Module 48.

The Measurement Module 48 converts the output of the Signal Cancellation Module 47 into an analog voltage 50 proportional to the signal-to-noise ratio and applies it to the Computer Module 49. A separately-buffered analog output 51 is provided for observation and/or recording.

The Computer Module 49 converts the analog SNR into a BCD equivalent which is routed to the display 52. A separately-buffered digital output 53, whose update rate is unaffected by the Display Rate control, is also available.

As mentioned above, in the SQM, the "stronger" signal is presumed to be the desired signal, and the "weaker" signal is presumed to be the attendant co-channel noise and/or interference (from whatever source). Thus, if a technique can be implemented to suppress the desired signal, the average power, N, in the attendant co-channel disturbance can be measured separately. If the co-channel disturbances are uncorrelated with the signal over the power averaging time interval, then the average power of the sum of signal and co-channel disturbances is the sum of the average powers of the two; i.e., S+N. Consequently, if we can measure N separately, and S+N, then $S=(S+N)-N$, and S/N is thereby determined.

Alternatively, the value of S/N can be determined by first normalizing the total power of the sum of signal plus co-channel disturbance to a constant value by linear AGC action based on the rms value of the resultant of signal and co-channel disturbance. The average power in the noise component of the normalized resultant of signal and noise is then inversely proportional to (1+S/N), which is approximately equal to S/N for large S/N. Therefore, if the normalizing operation is followed by cancellation of the signal component, S/N can be computed directly from the average power of the remaining noise component. This is the technique illustrated here.

With reference to FIG. 9, the purpose of the Input Module is to accept a signal at a prescribed intermediate frequency (e.g., 10 MHz), within a prescribed bandwidth (e.g., ±2 MHz) and within a prescribed dynamic range (e.g., ±10 dBm to −20 dBm).

The range of the "instantaneous" fluctuations of the envelope of the resultant of signal plus all disturbances present is compressed in the input module 46—by linear AGC action—to within a small range (e.g., ±0.25 dB) centered about a prescribed output level (e.g., −6 dBm). The benefits derived from this compression of the fluctuations in the level of the resultant of signal plus disturbance can be fully understood only after the manner in which it is accomplished is explained.

Figure 10:
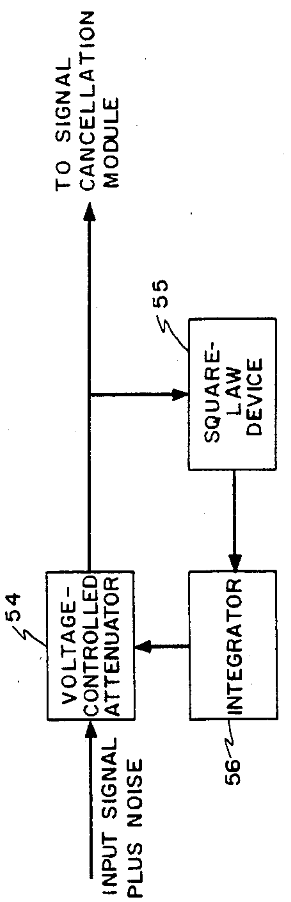
FIG. 10 is a schematic illustration of an embodiment of the present invention for deriving a signal approximately related in value to the signal to noise ratio of a received signal.

An illustrative functional design of the Input Module is shown in FIG. 10. The average power in the sum of signal plus disturbances present is determined by taking the square of this sum in a square-law device 55 and applying its output to an integrator 56 in which the signal is integrated over a nominal time interval $T_{ave}$ (e.g., 100 m sec, 10 m sec or 1 m sec) depending on the fluctuation rate of the resultant envelope. The average so derived must not "smooth out" the envelope fluctuations; rather, it must "follow" them and hence represent the change in the value of the average power from one $T_{ave}$ interval to the next. When this "instantaneous" value of average power is applied to a voltage-controlled attenuator 54, the result is equivalent to dividing the amplitudes of the signal and of the disturbance each by $$\sqrt{S+N}$$

where S=average power of signal and N=average power of (independent) disturbance. Consequently, the average power in the "noise" component of the output of the Input Module is proportional to $$\frac{N}{S+N} = \frac{1}{1+(S/N)}$$

Thus, upon suppression of the signal component in the Signal Cancellation Module 47, the average power in the remainder (or non-signal) component can be calibrated to yield the value of S/N.

Another important benefit of the level-fluctuation compressive action of the Input Module 46 lies in the facts that the operation of the signal suppressor in 47 is normally optimized for a fixed level of drive at its input, and the level of the output of the signal suppressor 47 is directly dependent on the input level and hence its functional dependence upon S/N would be disturbed (or interfered with) significantly by uncompressed fluctuations in the level of the resultant input signal.

The purpose of the Signal Cancellation Module 47 is to cancel out the signal component present in the output of the Input Module 46. As explained earlier, cancellation of this signal component leaves a noise (or total attendant disturbance) component whose mean squared value is inversely proportional to (1+S/N).

The signal cancellation in 47 can be carried out by one of the methods described in earlier parts of this application.

The purpose of the Measurement Module 48 is to determine accurately the average power in the noise component delivered at the output of the Signal Cancellation Module 47. The manner in which this determination is performed is brought out in the illustrative functional diagram shown in FIG. 11.

Figure 11:
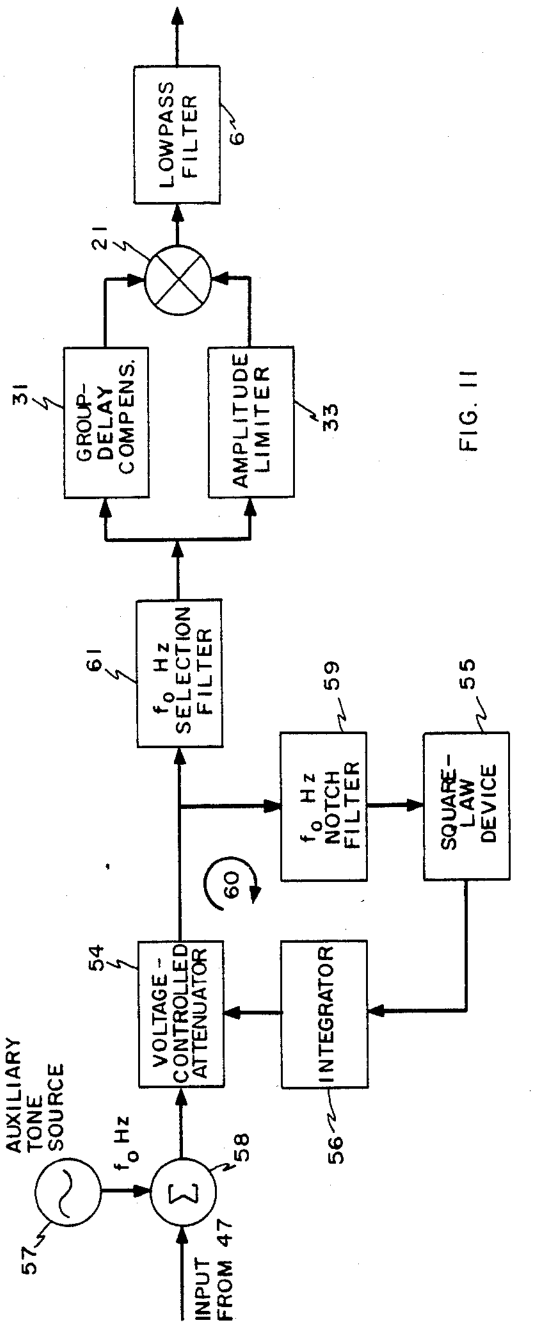
FIG. 11 is a schematic illustration of an embodiment of the present invention for measuring the average power of an input signal.

Examination of FIG. 11 shows that the Measurement Module 48 embodies a part (the AGC loop 60) that is similar basically to the Input Module 46, and a part that is similar, with the exception of what is passed to the output, to the scheme of FIG. 8(*a*). The AGC loop 60 adjusts the gain on the basis of the mean-squared value of the noise component. This gain then scales the amplitude of an auxiliary tone (at $f_o=8$ MHz in FIG. 11) that is added in a summing circuit 58 to the input but is excluded from the mean-square measurement in circuits 55 and 56 by the ($f_o=8$ MHz) Notch Filter 59 in the AGC 60 feedback branch.

The average power in the auxiliary ($f_o=8$ MHz) tone, after the AGC action, is inversely proportional to the average power in the noise component present at the input to the Measurement Module 48. The scheme starting with 61 in FIG. 11 is intended for measuring the average power in the ($f_o=8$ MHz) auxiliary tone. Accordingly, a filter 61 is first used to exclude all but the ($f_o=8$ MHz) tone, and this tone is then applied to a linear circuit path 31 (including adjustable delay compensation) in parallel with a hard amplitude limiter 33. The product obtained as an output signal of the mixer is the product 21 of the hard-limited output and the linear-path output. This product has a DC component that is directly proportional to the average power in the auxiliary tone as scaled by the action of the AGC loop 60.

The purpose of the Computer Module 49 is to operate on the analog output of the Measurement Module 48, which ideally represents the function 1/(1+S/N), and to convert this analog function into a binary representation of the value of S/N whose timing corresponds to the data to which the S/N number applies. Accordingly, the principal functions that the Computer Module 49 should perform are:

(a) Analog-to-Digital conversion of the input DC voltage that represents the measured value of S/N;

(b) Expansion of the resolution of the values of S/N beyond the resolution provided by an economical A/D converter; and (c) Compensation of the time delay differences between the data and the corresponding S/N reading.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. An envelope detector for an input signal of frequency $\omega$ comprising:

an amplitude limiter for providing an amplitude limited replica of the input signal;

means for multiplying said replica and the input signal; and means for filtering the product of said multiplying means to pass all frequencies that make up the envelope including DC and block all frequencies that make up a component in said product centered at the frequency $2\omega$.

2. An apparatus for generating an output signal having an amplitude proportional to the reciprocal of the amplitude of one of several signals linearly combined in an input signal, comprising:

an oscillator for providing a signal having a reference frequency $\omega_o$;

means for summing the input signal and the reference frequency signal for providing an output sum signal; means for amplitude limiting said output sum signal to produce an amplitude limited sum signal;

a bandpass filter centered about the frequency $\omega_o$ for filtering the amplitude limited sum signal; and means for multiplying the input signal with the signal filtered by said bandpass filter.

3. The apparatus of claim 2 further comprising a bandpass filter, centered about the pass band frequency ($\omega_c$) of the apparatus, for filtering the amplitude limited sum signal; thereby providing a signal having the phase of the strongest of the linearly combined signals.

4. A method for generating an output signal having an amplitude proportional to the reciprocal of the amplitude of one of several signals linearly combined in an input signal, comprising the steps of:

providing a signal having a reference frequency $\omega_o$;

summing the input signal and the reference frequency signal to provide an output sum signal;

amplitude limiting the sum signal to provide an amplitude limited replica of the sum signal;

filtering the amplitude limited sum signal to pass frequencies in a band centered about the frequency $\omega_o$; and multiplying the input signal with the filtered signal.

5. A method of suppressing an undesired one of two summed cochannel sinusoidal signals, comprising the steps of:

amplitude limiting the sum of the two cochannel signals; and multiplying the frequency of said amplitude-limited sum of signals by a factor k, wherein the value of k is selected responsive to the amplitude ratio, a, of the two cochannel signals such that the Bessel function $J_o(ka)$ is zero.

6. A method of suppressing an undesired one of two summed cochannel sinusoidal signals, comprising the steps of:

amplitude clipping the sum of the two cochannel sinusoidal signals which generates a signal whose spectrum comprises (a) a fundamental spectral zone that includes the frequencies of the sum of the two cochannel sinusoidal signals; and (b) other spectral zones at harmonics of the fundamental zone frequencies; and filtering said clipped sum to select a spectral zone at a harmonic of the fundamental spectral zone.

* * * * *